(12) United States Patent
Hiraiwa et al.

(10) Patent No.: US 6,586,951 B2
(45) Date of Patent: Jul. 1, 2003

(54) DISPLACEMENT DETECTING DEVICE

(75) Inventors: Yuji Hiraiwa, Anjo (JP); Keiji Yasuda, Handa (JP); Kouji Akashi, Gamagori (JP)

(73) Assignee: Aisin Seiki Kabushiki Kaisha, Kariya (JP)

( * ) Notice: Subject to any disclaimer, the term of this patent is extended or adjusted under 35 U.S.C. 154(b) by 0 days.

(21) Appl. No.: 09/988,294

(22) Filed: Nov. 19, 2001

(65) Prior Publication Data

US 2002/0070735 A1 Jun. 13, 2002

(30) Foreign Application Priority Data

Nov. 17, 2000 (JP) .......................................... 2000-351658

(51) Int. Cl.[7] .............................................. G01R 27/08
(52) U.S. Cl. ...................................... 324/716; 324/713
(58) Field of Search ........................ 324/525, 713–716, 324/691, 723; 338/160; 73/117.3, 118.1

(56) References Cited

U.S. PATENT DOCUMENTS 4,719,795 A * 1/1988 Eitoku et al. ............... 73/118.1
5,743,132 A * 4/1998 Hosoya et al. ............. 73/118.2
6,075,371 A * 6/2000 Kitamura .................... 324/716
6,441,626 B1 * 8/2002 Mase .......................... 324/714

FOREIGN PATENT DOCUMENTS

JP          9-311012         5/1996

* cited by examiner

*Primary Examiner*—Christine Oda
*Assistant Examiner*—Amy He

(57) ABSTRACT

A displacement detecting device includes a power supply line made of a conductor on a substrate, an earth line made of a conductor on the substrate, a plurality of output lines made of a conductor on the substrate, a resistance formed between the power supply line and the earth line on the substrate, and a brush sliding on the resistance and at least one of the output lines electrically connecting between the resistance and at least one of the output lines, the displacement detecting device generating the output signal from the output lines based on the position of the brush, wherein one of the power supply line and the earth line is disposed between the output lines.

2 Claims, 3 Drawing Sheets

DISPLACEMENT DETECTING DEVICE

CROSS REFERENCE TO RELATED APPLICATIONS

This application is based on and claims priority under 35 U.S.C. §119 with respect to Japanese Patent Application 2000-351658, filed on Nov. 17, 2000, the entire content of which is incorporated herein by reference.

FIELD OF THE INVENTION

This invention relates to a displacement detecting device sliding a brush on a resistance and generating an output signal based on a rotational portion of the brush. Especially, this invention relates to an arrangement of a circuit pattern of a power supply line, an earth line, and an output line on a contact-type displacement sensor.

BACKGROUND OF THE INVENTION

Conventionally, this species device (e.g., displacement sensor) includes a resistance coat for serving as resistance on one rotational side (e.g., shaft) and a non-rotational side (e.g., housing) and a brush for sliding on the resistance coat on another side thereof. The brush is fixed with the rotational side (e.g., shaft) via a brush holder, and the brush is rotated according to the movement of a detected object. On a structure such as this, the brush slides on the resistance when supplying a predetermined voltage between end portions of the resistance. When the brush slides on the resistance, as an output voltage of the sensor changes according to the position of the brush, a displaced position of the detected object can be detected. For example, a device such as this is disclosed in Japanese patent laid open No. H09(1997)-311012.

The device (sensor) shown in this publication discloses that two output terminals (a first terminal generating an output voltage $V_{TA}$, and a second terminal generating an output voltage $V_{TB}$) outputs a signal output respectively when the predetermined voltage is supplied between a power supply terminal (terminal supplied to a predetermined voltage V1) and an earth terminal (terminal connected with the earth) on a substrate. The sensor includes four terminals, two arc-shaped conductors, a sliding resistance, and a pair of brushes.

The power supply terminal electrically contacts with the earth terminal via an offset resistance and the sliding resistance. One output terminal electrically connects with a conductor and the earth terminal electrically connected with the power supply terminal via the sliding resistance; another output terminal electrically connects with the conductor. Two sliding members (two brushes) are fixed on a shaft side rotating with the detected object on this construction. The brushes slide on the sliding resistance and the conductor simultaneously, and the brushes are electrically connected with the sliding resistance and the conductor. Thus, the signal output according to a position of the detected object (e.g., a rotational position of the brush) is generated from two output terminals. However, two arc-shaped output patterns are formed at both sides of the shaft on the above-mentioned construction, and a power supply line and an earth line are formed at the both sides. Therefore, when an electrical short happens on the output line formed by a conductor for whatever reason, a failure occurs wherein the output terminal outputs half of the supplied voltage for the terminal supplying a power source. The half of the supplied power voltage does not change even if the position of the brush was changed. Therefore, when the failure occurs, under the construction outputting half of the supplied voltage, the controller controlling the output signal treats the generated voltage from the output terminal as an output signal of a normal condition even if the failure occurs.

SUMMARY OF THE INVENTION

In view of the foregoing, it is an object of the present invention to provide a construction which detects a failure even if a short between the output terminals occurs.

According to an aspect of the present invention, a displacement detecting device includes a power supply line made of a conductor on a substrate, an earth line made of a conductor on the substrate, a plurality of output lines made of a conductor on the substrate, a resistance formed between the power supply line and the earth line on the substrate, and a brush sliding on the resistance and at least one of the output lines and electrically connected between the resistance and at least one of the output lines. The displacement detecting device generates the output signal from the output lines based on the position of the brush, wherein one of the power supply line and the earth line is disposed between the output lines.

Therefore, even if a plurality of output lines are disposed adjacent to each other, one of the power supply line and the earth line is formed between nearby output lines. For whatever reason, when an electrical short happens between the output lines, the voltage of the output line comes to the predetermined voltage (supplied voltage) supplied for the sensor or the earth voltage (e.g., 0V). Therefore, when the electrical short between the output terminals happens, it is able to detect the failure.

BRIEF DESCRIPTION OF THE DRAWINGS

The features and advantages of a displacement detecting device according to the present invention, and others, will be more clearly appreciated from the following description considered in conjunction with the accompanying drawing figures in which like elements bear like reference numerals and wherein.

DETAILED DESCRIPTION OF PREFERRED EMBODIMENTS OF THE INVENTION

Hereinafter, a preferable embodiment of the present invention will be described referring to FIGS. 1–7.

Figure 1:
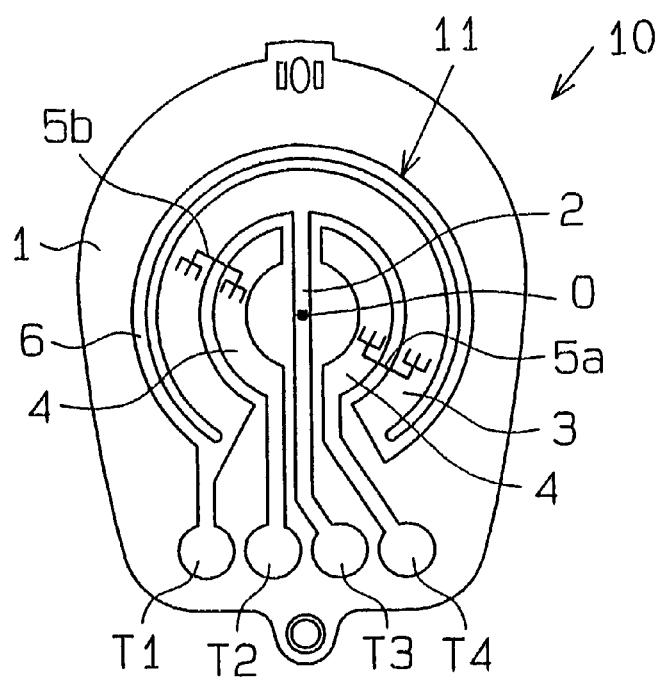
FIG. 1 is a plane view showing a circuit pattern of a power source line, an earth line, and an output line formed on substrate of a displacement detecting device according to an embodiment of the present invention.
Figure 2:
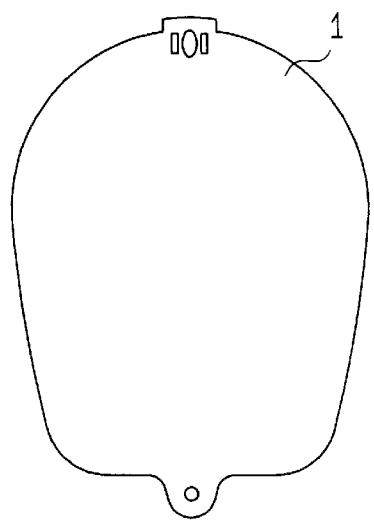
FIG. 2 is a plane view showing a circuit pattern formed on the substrate shown in FIG. 1 and showing the step of forming the circuit pattern.
Figure 3:
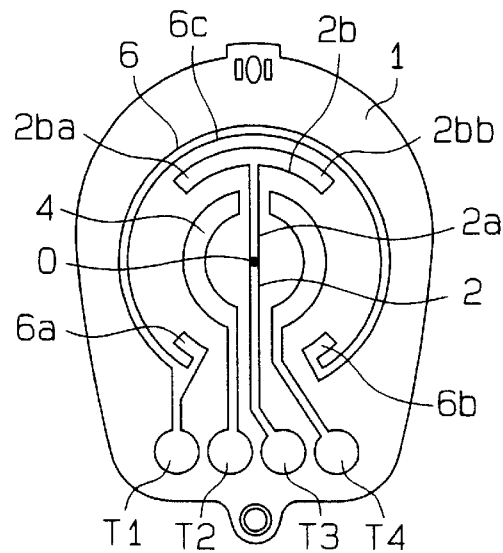
FIG. 3 is a plane view showing a circuit pattern formed on the substrate shown in FIG. 1 and showing the step of forming the circuit pattern.
Figure 4:
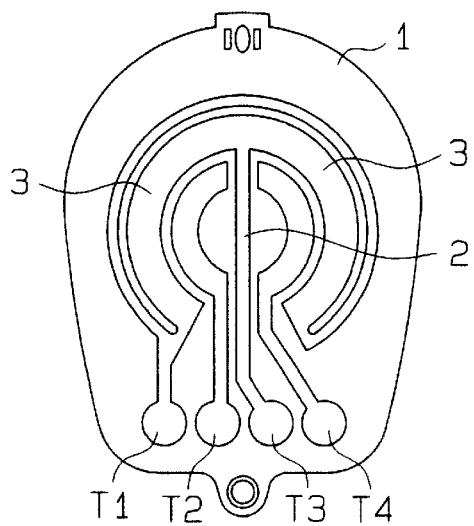
FIG. 4 is a plane view showing a circuit pattern formed on the substrate shown in FIG. 1 and showing the step of forming the circuit pattern.
Figure 5:
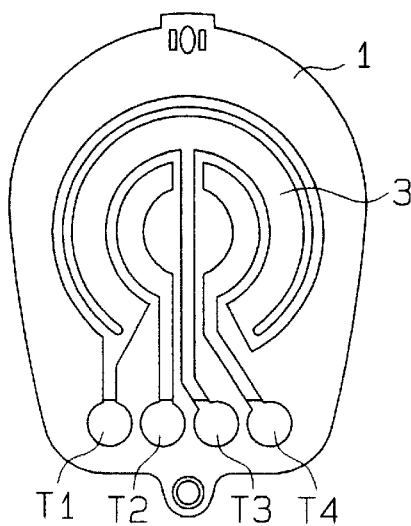
FIG. 5 is a plane view showing a circuit pattern formed on the substrate shown in FIG. 1 and showing the step of forming the circuit pattern.

FIG. 1 shows a circuit pattern 11 formed on a substrate 1 using a displacement detecting device (e.g., displacement sensor) 10. On the substrate 1, four terminals T1–T4 are disposed in a straight line manner on the substrate 1. As shown in FIG. 1, an arc-shaped circuit pattern 11 is continuously formed on the substrate 1 from each of the terminal T1 to T4.

Referring to FIGS. 2–5, the circuit pattern 11 on the substrate 1 will be explained hereinafter in detail. The substrate 1 (shown in FIG. 2) is made of grass epoxy resin, etc. Four round-shaped terminals T1–T4 are collaterally formed on the substrate 1, an earth line 6 made of a conductor (conductive material) including an arc portion 6c centering on a center point O from the terminal T1 which is continuously formed on the substrate 1. Both of end portions 6a, 6b at the arc portion 6c of the earth line 6 are approximately U-shaped. Further, arc portion 6c of the earth line 6 centering on a point O from the terminal T2 and the output line 4 of which is a concentric arc are formed on the substrate 1. Furthermore, the output line 4 of which is a concentric arc the same as the arc of the earth line 6 centering on the point O from the terminal T4 is formed on the substrate 1. Two arc portions of the output lines 4 are symmetrically shaped for a straight line (a straight line portion) 2a passing through the point O. Further, the straight line portion 2a passing through the point O from the terminal T3 and the power supply line 2 made of a conductor (conductive material) including symmetrically shaped arc portion 2b centering on the point O is formed on the substrate 1. The circuit pattern 11 including the terminals T1–T4, the power supply line 2, the earth line 6, and the output line 4 is formed by screen printing, etc., by using a good conductive material such as Ag, etc. (shown in FIG. 3).

On the other hand, a resistance coat with low resistance is formed on a style which is a concentric arc shaped centering on the point O between an approximately U-shaped end portion 6a of the earth line 6 and an end portion 2ba of the power supply line 2, and between an approximately U-shaped end portion 6b of the earth line 6 and an end portion 2bb of the power supply line 2. Simultaneously, a low resistance coat is formed by screen printing such as covering surfaces of the terminals T1–T4, the power supply line 2, and the earth line 6 (shown in FIG. 4). Further, high resistance coat including carbon on the power supply line 2, the earth line 6, and the output line 4 except the round shaped terminals T1–T4 is formed by screen printing (shown in FIG. 5). According to the construction, arc portions formed between the end portion 6a of the earth line 6 and the end portion 2ba of the power supply line 2, and between the end portion 6b of the earth line 6 and the end portion 2bb of the power supply line 2 are arc-shaped centering on the point O. The arc portion comes to a resistance which is formed with a resistance coat with two layers (high resistance coat and low resistance coat).

Further, the brush 5 (5a, 5b) is disposed on the substrate 1, and the brush 5 contacts with the circuit pattern 11 at a predetermined position respectively, both brushes 5a, 5b slide on the circuit pattern 11. The brush 5 is fixed with a base member 16, the brush 5 is approximately U-shaped, and the brush 5 includes an end portion connecting with the circuit pattern 11. The brushes 5a, 5b are respectively disposed on a symmetrical position for the point O, each of the end portions of the brushes 5a, 5b suitable for a circumferential direction. The base member 16 fixed with the brushes 5a, 5b is rotated by a rotation of a lever 17, so that the brushes 5a, 5b rotate around the point O. The brushes 5a, 5b are electrically connected with the resistance 3 (end portions 6a-2ba, end portions 6b-2bb) by sliding on the output line 4, and the output signal can be extracted from the terminals TM2, TM4.

A whole construction of the displacement sensor 10 will be described hereinafter referring to FIGS. 6 and 7. FIG. 7 is an arrow diagram shown in FIG. 6. Four terminals 13 and a bushing 14 are formed by insert forming on a housing 12. A portion which the bushing 14 is disposed on a housing 12 is a boss portion 12a. A spring 18 is disposed around the boss portion 12a, and the base member (round-shaped brush holder) 16 fixed with the shaft 15 which is formed by inserting and forming in the housing 12 at an upper portion of the bushing 14 shown in FIG. 6. Two brushes 5a, 5b are disposed at a position which is a symmetric of an upper surface of the base member 16. A method to fix the brushes 5a, 5b onto the base member 16, a projection formed on the base member 16 inserting into a hole formed in the brushes 5a, 5b, respectively, thereby an end portion of the projection is heated by heat caulking etc., the brushes 5a, 5b are fixed with the base member 16.

Figure 6:
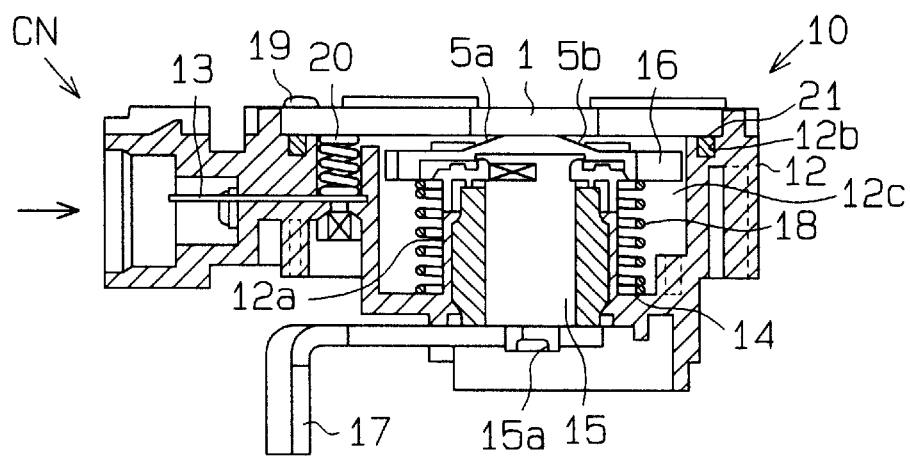
FIG. 6 is a cross sectional view of the displacement detecting device according to the embodiment of the present invention.
Figure 7:
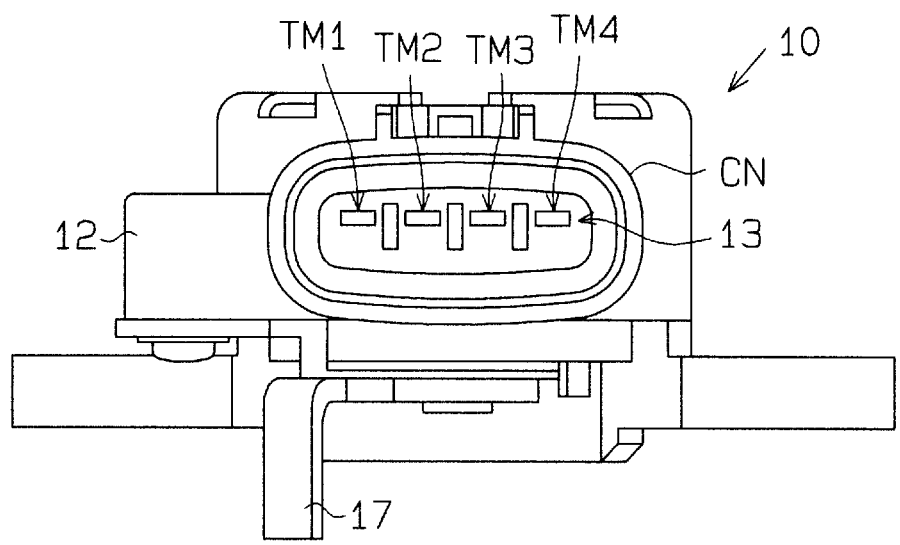
FIG. 7 is an arrow diagram shown in FIG. 6.

One end of the spring 18 connects with an inner wall (bottom wall) of a lower side of the housing 12 forming the boss portion 12a as shown in FIG. 6, and another end thereof connects with a back surface of the base member 16. When the base member 16 is fixed with the boss portion 12a, the base member 16 is pushed toward a bush side against a spring force of the spring 18, approximately L-shaped lever 17 is fixed with an end portion 15a of the shaft 15, the end portion 15a of the shaft 15 is caulked so as to integrally rotate the base member 16 with the lever 17. Therefore, when lever 17 connecting with the detected objects directly/indirectly rotates, the brushes 5a, 5b fixed onto the base member 16 rotates within a concave portion formed 15 in an inner portion of the housing 12 by a rotational movement.

On the other hand, one end of the four terminals 13 formed by inserting and forming in the housing 12 connect with an external connector (not shown). The voltage is supplied from a connector portion CN to the sensor 10 by the external connector. The output signal can be extract for an outside of the sensor 10. Four springs 20 are respectively disposed on another end of the four terminals 13 so as to establish an electrical connection. The substrate 1 formed the circuit pattern 11 on the back side is covered on an upper surface of the spring 20. When the substrate 1 is covered on the housing 12, a seal member 21 which is ring shaped is disposed in a circular groove 12b which is formed on an outside of an inner wall of an opening 12c of the housing 12. The substrate 1 is disposed on the housing 12 at a predetermined position, the upper surface including the opening 12c of the housing 12 is closed by the substrate 1, which is fixed by a method of caulking, etc. mentioned above or a fix member 19 such as a screw, etc. On the sensor 12, as the substrate 1 formed the circuit pattern 11 at an inner surface sealed by the seal member 21 so as to prevent an encroaching of water drop from the outside of the housing 12, thereby sensor 10 can be sealed securely.

Under a stable condition in which the substrate 1 is fixed with the housing 12 with the seal performance, the terminals 13 are electrically connected with the terminals T1–T4 by the spring 20 respectively, a contact portion of approximately U-shaped tip of the brushes 5a, 5b contacts with the resistance 3 of the circuit pattern 11 and the output line 4, respectively, and an electrical connection can be established. Thereby, the terminal TM1 in the terminal 13 of the connector CN electrically connects with the terminal T1 on the substrate 1, and the terminal TM2 electrically connects with the terminal T2 on the substrate 1. Further, the terminal TM3 is electrically connected with the terminal T3 on the substrate 1, and the terminal TM4 is electrically connected with the terminal T4 on the substrate 1.

According to the above-mentioned construction, for example, when the terminal TM4 connecting with earth (ground), a predetermined voltage (e.g., 5V) is supplied to the terminal TM3, a voltage on both sides of the resistance 3 is connected to the power supply voltage (5V). Then, when the lever 17 is moved by a movement of the detected object, the brush 5 slides on the circuit pattern by a rotational movement of the lever 17. When the brush 5 slides on the circuit pattern, a voltage according to a brush position of the brush 5 is generated from the terminals TM2, TM4.

In this case, two output signals generated from the terminals TM2 and TM4 will change depending on the brush position. When the output signal (e.g., voltage) is monitored by the changes of the brush position, the outputted two signals from the terminals TM2, TM4 cross over each other. More specifically, when the brushes 5a, 5b gradually rotate toward a clockwise direction as shown in FIG. 1, the voltage of another output terminal (e.g., TM4) gradually decreases. Correspondingly, when the brushes 5a, 5b rotate toward a counter-clockwise direction, voltage of one output terminal (e.g., TM2) gradually decreases, but voltage of another output terminal (e.g., TM4) gradually increases.

Next, a failure on the circuit pattern 11 will be explained hereinafter. In this embodiment, the arc-shaped output line 4 is formed at a symmetry position against the point O, and a straight line portion 2a of the power supply line 2 is formed between the adjacent two output lines. For this reason, a failure of the brush 5 (e.g., the brush 5 departs from the base member 16, a short between the terminals occurs, etc.) or when the two output lines short each other for some reason (e.g., a clip by conductive exogenous material on the circuit pattern 11), the power supply line is formed between the output lines. Thereby voltage of the output terminals TM2 and TM4 connects to the supplied voltage for the sensor 10 (predetermined voltage supplied to terminal T3). As a result, voltage of the output terminals TM2 TM4 always comes to a predetermined voltage, independent of a rotation of the brush 5. Thereby, the failure of the sensor 10 can be detected.

In another embodiment, if a terminal for supplying the predetermined voltage for the sensor 10 is TM1, and a terminal for grounding is TM3, a line connecting TM1 with a power supply line, and a line connecting TM3 with an earth line, thus the earth line is formed between adjacent two output lines 4. Therefore, a failure of the brush 5 (e.g., the brush 5 departs from the base member 16, a short between the terminals occurs, etc.), or when the two output lines short each other for some reason (e.g., a conductive exogenous material is clipped on the circuit pattern 11), the earth line is formed between the output lines. Thereby voltage of the output terminals TM2, TM4 goes to the earth voltage (e.g., 0V). As a result, voltage of the output terminals TM2, TM4 always goes to the earth voltage (e.g., 0V) independent of a rotational position of the brush 5. Therefore, the failure of the sensor 10 can be surely detected. Further, in this embodiment, the terminal TM1 is an earth terminal; the terminal TM3 is a power supply terminal supplying a predetermined voltage (e.g., 5V) that does not limit but is able to change as needed. Further, in this embodiment, two output lines 4 are formed on the substrate 1, more than three output lines may be formed on the substrate 1. The power supply line 2 or the earth line 6 between the adjacent output lines is formed, when the brush 5 connects with the circuit pattern 11 or a short between the output lines by clip of conductive exogenous material occurs for some reason, the terminals TM2 and TM4 generating the output signal go to the power supply voltage (e.g., 5V) or the earth voltage (e.g., 0V). As the result, the sensor 10 can detect a failure.

According to the present invention, if a plurality of output lines are adjacent, the power supply line or the earth line is formed between the adjacent output lines, when the output lines connect each other by some reason, the voltage of the output line comes to the predetermined voltage (the power supply voltage) which supplied to the sensor 10 or the earth voltage (e.g., 0V), and the sensor can correctly detect the failure. Therefore, even if the short between the output terminals occurs, the sensor 10 can correctly detect the failure.

The invention may be embodied in other specific forms without departing from the spirit or essential characteristic thereof. The present embodiment is therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A displacement detecting device comprising:

a power supply line made of a conductor on a substrate;

an earth line made of a conductor on the substrate;

a plurality of output lines made of a conductor on the substrate;

a resistance formed between the power supply line and the earth line on the substrate;

a brush sliding on the resistance around a point and at least one of the output lines and electrically connecting the resistance and at least one of the output lines, and the displacement, detecting device generating an output signal from the output lines based on the position of the brush, wherein one of the power supply line and the earth line passes through said point and is disposed between the output lines.

2. A displacement detecting device comprising:

a power supply line made by a conductive material on a substrate;

an earth line made by a conductive material on the substrate and connecting as an earth;

a plurality of output lines made by a conductive material on the substrate and connecting with a power source;

a resistance coat formed between the power supply line and the earth line on the substrate;

a brush for sliding between the resistance coat around a point and at least one of the output lines and electrically connecting between the resistance and at least one of the output lines, and the displacement detecting device generating an output signal from the output lines based on the position of the brush, wherein one of the power supply line and the earth line passes through said point and is disposed between the adjacent output lines.

* * * * *